United States Patent
Bergot (10) Patent No.: US 11,469,695 B2
(45) Date of Patent: Oct. 11, 2022

(54) AUTONOMOUS DEVICE FOR TRACKING THE USAGE TIME OF A GENERATOR SET, AND THE CORRESPONDING GENERATOR SET

(71) Applicant: SDMO Industries, Guipavas (FR)

(72) Inventor: Gilles Bergot, Guipavas (FR)

(73) Assignee: SDMO Industries, Guipavas (FR)

( * ) Notice: Subject to any disclaimer, the term of this patent is extended or adjusted under 35 U.S.C. 154(b) by 449 days.

(21) Appl. No.: 16/751,603

(22) Filed: Jan. 24, 2020

(65) Prior Publication Data
US 2020/0244198 A1    Jul. 30, 2020

(30) Foreign Application Priority Data

Jan. 30, 2019 (FR) ...................................... 1900882

(51) Int. Cl.
| | | |
|---|---|---|
| *H02P 9/02* | (2006.01) | |
| *H04W 4/80* | (2018.01) | |
| *G07C 3/08* | (2006.01) | |
| *H04W 4/021* | (2018.01) | |

(52) U.S. Cl.
CPC ................. *H02P 9/02* (2013.01); *G07C 3/08* (2013.01); *H04W 4/021* (2013.01); *H04W 4/80* (2018.02)

(58) Field of Classification Search
CPC ... H02P 9/02; G07C 3/08; G07C 3/02; H04W 4/021; H04W 4/80; G01R 31/343; G01D 21/02
See application file for complete search history.

(56) References Cited

U.S. PATENT DOCUMENTS

| | | | |
|---|---|---|---|
| 6,138,078 A | 10/2000 | Canada et al. | |
| 8,489,348 B2* | 7/2013 | Shirriff | G01R 31/371 320/134 |
| 10,430,883 B1* | 10/2019 | Bischoff | G06Q 20/14 |
| 10,558,744 B2* | 2/2020 | Thomas | G06F 40/18 |

(Continued)

FOREIGN PATENT DOCUMENTS

| | | |
|---|---|---|
| DE | 29909200 U1 | 10/2000 |
| EP | 0319422 A1 | 6/1989 |

(Continued)

OTHER PUBLICATIONS

Chinese Office Action for Chinese Application No. 202010073905. 7, dated Dec. 28, 2021, 13 pages (including English translation).

(Continued)

*Primary Examiner* — Tung S Lau
(74) *Attorney, Agent, or Firm* — Lempia Summerfield Katz LLC (57) ABSTRACT

The disclosure relates to an autonomous device for tracking the usage time of a generator set, capable of providing an operating time of the generator set. The module includes at least one first sensor (101) capable of measuring a first parameter representing a state of operation of said generator set (9), a data processor furnishing the characteristic information for an operating time, as a function of the first parameter, storage of the characteristic information for an operating time, and a transmitter capable of transmitting the characteristic information for an operating time to a terminal or an external server.

20 Claims, 7 Drawing Sheets

(56) References Cited

U.S. PATENT DOCUMENTS

| | | | |
|---|---|---|---|
| 10,844,820 B2* | 11/2020 | Meraux | F02D 41/042 |
| 11,068,985 B1* | 7/2021 | Bischoff | G06Q 20/102 |
| 11,076,355 B2* | 7/2021 | Nakagawa | H04W 52/0261 |
| 2007/0209435 A1* | 9/2007 | Sauerlaender | G07C 1/10 |
| | | | 73/432.1 |
| 2011/0301890 A1* | 12/2011 | Shirriff | G01R 31/392 |
| | | | 702/63 |
| 2015/0226805 A1 | 8/2015 | Albers et al. | |
| 2016/0049018 A1* | 2/2016 | Groß | G07C 5/02 |
| | | | 701/99 |
| 2016/0373040 A1* | 12/2016 | Auer | H02P 9/04 |
| 2016/0373542 A1* | 12/2016 | Baba | H04L 67/567 |
| 2017/0236339 A1* | 8/2017 | Camisa | G07C 5/008 |
| | | | 701/32.4 |
| 2018/0182182 A1* | 6/2018 | Meyer | G07C 5/008 |

FOREIGN PATENT DOCUMENTS

| | | |
|---|---|---|
| FR | 2635894 A1 | 3/1990 |
| GB | 2338848 A | 12/1999 |
| WO | 2008009554 A1 | 1/2008 |

OTHER PUBLICATIONS

European Patent Application No. 20154427.7, Search report dated May 11, 2020, 8 pages.

French Patent Application No. 1900882, Search report dated Jan. 30, 2019, 6 pages.

\* cited by examiner

AUTONOMOUS DEVICE FOR TRACKING THE USAGE TIME OF A GENERATOR SET, AND THE CORRESPONDING GENERATOR SET

CROSS REFERENCE TO RELATED APPLICATION

This application claims the benefit of priority to French National Patent Application No. 1900882, filed on 30 Jan. 2019, which is hereby incorporated by reference in its entirety.

1. FIELD

The field is that of tracking the use and maintenance of generator sets, and in particular portable generator sets intended in particular for occasional or temporary use on any type of site and terrain.

The present disclosure thus finds particular use in the field of portable generator sets and more generally mobile systems including means of producing electricity, such as soldering sets or lighting poles. These various systems will hereinafter be known by the term "generator set".

2. PRIOR ART

Portable generator sets enable users to have a device for furnishing electricity temporarily or continuously, or for furnishing electricity on any type of site or terrain not supplied with electricity in a fixed manner (construction, housing, harbors, etc.). They can be owned by private individuals or professionals, or used on location by rental equipment companies or made available by equipment leasing companies.

Classically, a generator set includes a chassis on which in particular an engine and an alternator are mounted. The engine, typically a thermal engine, drives the alternator in rotation in such a way as to produce the electricity.

The generator sets require regular maintenance, depending on the identified operating times as determined by the manufacturer and mentioned for example in the instruction materials. It is consequently useful to measure the durations of the use, or operation, of a generator set in order to determine when maintenance is necessary.

Hence it is important that the user, or the person responsible for this on the premises of a rental company, knows these durations and defines in good time when maintenance operations are required and performs the required maintenance operations, or sees that they are performed, in good time. This is necessary in order to guarantee the proper function and the reliability of the generator set.

Certain sets, particularly high-capacity sets, are equipped with integrated tracking means (e.g., tracking device) that measure the presence of an electrical current and/or voltage produced by the set, and means for calculating (e.g., calculator) the corresponding operating times and for managing maintenance. On the other hand, portable generator sets generally have such a device.

In fact, these devices are not easily adaptable to portable generator sets, especially by reason of compactness and/or the production cost, since they are sold commercially at relatively low prices.

Users must therefore make their own estimate of the operating times and thus the times when maintenance is needed. This lack of tracking other than manually is a disadvantage of such portable generator sets, since they can consequently result in irregular or insufficient upkeep or maintenance, since for proper operation, the generator sets require regular maintenance and upkeep so that their performance and durability, in particular, are unchanged.

Poor tracking of the upkeep of these portable generator sets, which can also be associated with poor handling (impacts, exposure to extreme temperatures, etc.), can lead to faster deterioration of the generator set and hence to a shorter service life than intended, which is not satisfactory.

Furthermore, in addition to the possibility of deterioration of the generator set, irregular maintenance, that is, maintenance not conforming to manufacturers' recommendations, can lead to risks for the users.

Hence there is a need to improve these portable generator sets.

3. BRIEF DESCRIPTION

One objective of the present disclosure is accordingly to at least partially overcome these disadvantages of the prior art.

This objective, as well as others which may become apparent in the course of the present description, are achieved with the aid of an autonomous device for tracking the usage time of a generator set, capable of furnishing at least one piece of characteristic information for an operating time of said generator set, the device including:
  at least one first sensor capable of measuring a first parameter representing a state of operation of said generator set;
  processing means (e.g., a data processor) furnishing said characteristic information for an operating time, as a function of said first parameter;
  means for internal storage (e.g., memory) of said characteristic information for an operating time;
  transmission means (e.g., transmitter or communication interface) capable of transmitting said characteristic information for an operating time to a terminal or an external server.

Thus the disclosure proposes a novel and inventive approach making it possible to overcome, at least partially, the disadvantages of the prior art.

In particular, such a device enables a user to have an external tracking tool (such as a telephone, tablet, computer, server, etc.) that can track the operating time of the user's generator sets in an independently determined manner; in other words, in particular for measuring the electrical voltage or intensity produced, and consequently for performing the required maintenance operations, or having them performed, at the right time, it is unnecessary to be connected electrically to the generator set.

Using a sensor that is capable of measuring a parameter that represents an operating status of the generator set in an autonomous device makes it possible, without being electrically connected to it, to detect whether or not the generator set is in operation. What the sensor picks up is not an electrical current, but a physical phenomenon representing the fact that the set is in operation, such as vibrations or temperatures produced by the engine, or an electromagnetic field produced by the alternator. The autonomous device ensures that the operating times detected are added up and can transmit the overall length that it has compiled in such a way that it can be determined whether maintenance is necessary. Tracking the usage times of the generator set and hence tracking the maintenance of the generator set are thus made more reliable in a simple manner.

In addition, because there is no connection to the electricity-producing components (e.g., the alternator or output filter) of the generator set, it becomes possible, easily and inexpensively, to integrate the device with a portable generator set in such a way that, as applicable, it takes the form of an optional element capable of being put in place at any time over the lifetime of the generator set.

In one embodiment, the device includes at least one second sensor capable of measuring a second parameter representing a state of operation of said generator set, said generator set being considered functional by said processing means when the two sensors furnish parameters indicating a potential operation.

Because at least two sensors are used, it is possible to provide extremely accurate characteristic information about an operating time; in particular, this avoids detecting operation incorrectly, particularly when a sole sensor has detected a phenomenon that is similar to something that could be produced by the set, but in reality is from outside it. For example, such a piece of characteristic information cannot be perturbed, vibrated, or otherwise adversely affected by the outdoor environment in which the generator set is located (vibrations caused by transporting the set in a small truck, an electromagnetic field resulting from a high-tension wire, etc.), and consequently the transmission means transmit the characteristic information from an operating time that is reliable.

In this approach, the processing means considers the generator set to be in operation when the two sensors measure the parameters that indicate potential operation, or in other words when the first sensor and the second sensor both pick up a parameter indicating that the generator set is in operation.

In other words, the characteristic information for a state of operation is only delivered if the two sensors measure a parameter indicating that the set is in operation.

In one aspect of at least one embodiment, said sensor or sensors belong to the set including:
- a magnetic sensor capable of picking up the presence of a magnetic field generated by an alternator of said generator set;
- a vibration sensor capable of sensing vibrations generated by a engine of said generator set.

These two pieces of information are in fact characteristics of the operation of a generator set and are relatively easy to detect and analyze.

It is understandable that the presence of two sensors, one magnetic and the other for vibration, in a particular embodiment, is of interest, since it enables detecting that the two major elements of the set are in operation, that is, the alternator and the engine. This also makes it possible to effectively reduce the risk of incorrect detection.

In an aspect of at least one embodiment, said first sensor is a magnetic sensor capable of picking up the presence of an electromagnetic field of between 25 and 450 µT.

With this order of magnitude for the measurements of the first sensor, it is possible to dispense with detecting residual fields that are not characteristic of a state of operation of the generator set (for example, a magnetic field from the external environment).

In another aspect of at least one embodiment, said second sensor is a vibration sensor capable of picking up vibrations of between 20 and 200 Hz.

In a particular characteristic of at least one embodiment, the device includes geolocation means.

Such means can for example permit tracking and monitoring of the location and the use of the sets, as well as facilitating maintenance, especially in the context of managing a facility for portable generator sets (for example, a leasing company or a business that owns multiple sets) which may be contending with theft or with finding a set that had gone missing.

In a particular aspect of at least one embodiment, the communication means employ a Bluetooth® Low Energy communications protocol.

This makes it possible to achieve or optimize the autonomy of the device.

In still another aspect of at least one embodiment, the device includes unique means of identification.

This can make it possible to facilitate tracking and as applicable to identify the owner of the set, in the case of theft or loss.

The disclosure also relates to a generator set having or including an autonomous device for tracking usage times in accordance with one of the embodiments cited above.

In one characteristic of at least one embodiment, the autonomous device for tracking the usage time is affixed to the chassis by way of a coupling device or other mechanical fixation means.

In this case, the mechanical fixation means can be irreversible, and in particular adapted to detect whether they have been removed or tampered with (for example such that not all the hours of use are shown).

4. BRIEF DESCRIPTION OF THE DRAWINGS

Further characteristics and advantages of the invention will become more apparent from reading the following description of a particular embodiment, given by way of a simple illustrative and non-limiting example, and the appended drawings, in which.

5. DESCRIPTION OF ONE EMBODIMENT

In what follows, one embodiment is illustrated, by way of a simple illustrative and non-limiting example, with the aid of FIGS. 1 through 7.

Figure 1:
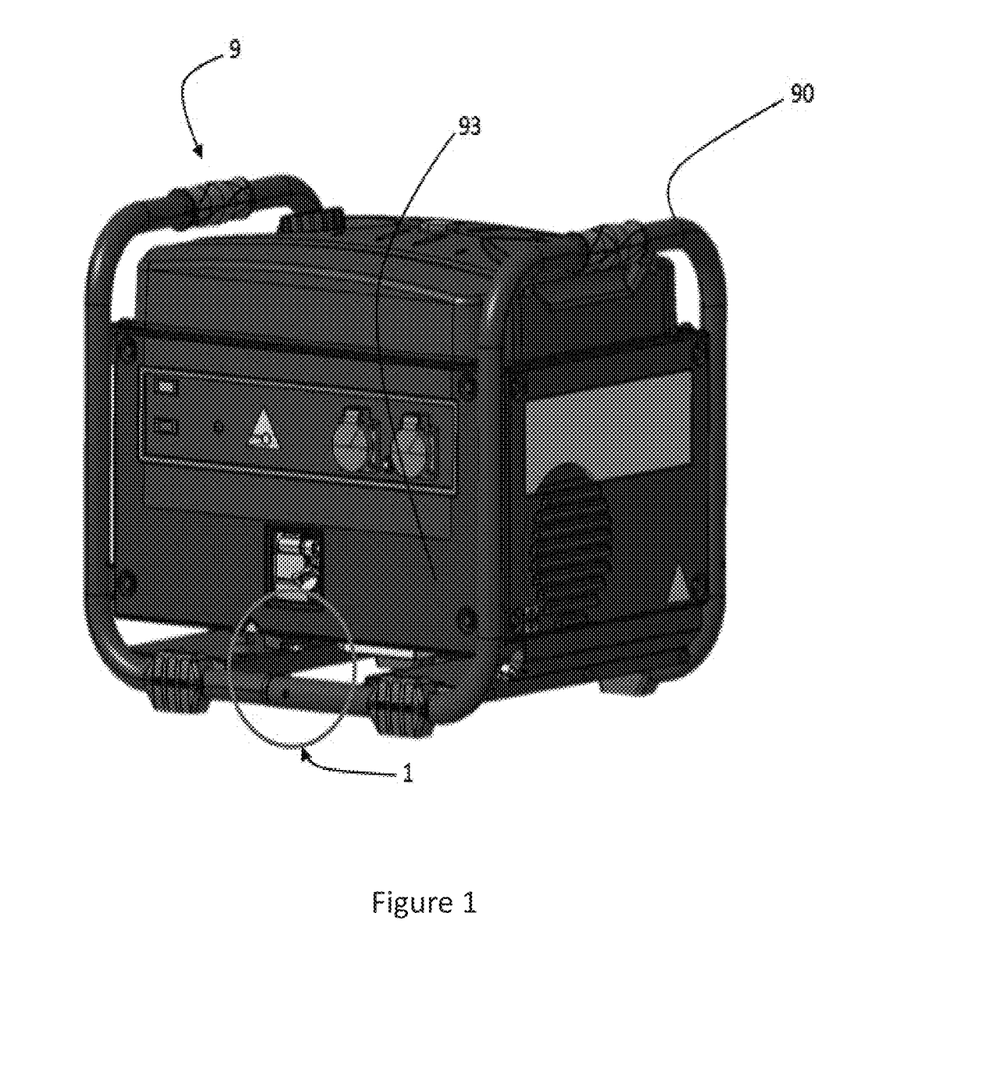
FIG. 1 is a perspective view of a generator set including an autonomous device for tracking usage time in one embodiment.

As shown in FIG. 1, the generator set 9 includes a chassis 90, also called a stand, that forms the rigid structure of the generator set, as well as a protective hood 93 and a side cover protecting the various components.

Figure 2:
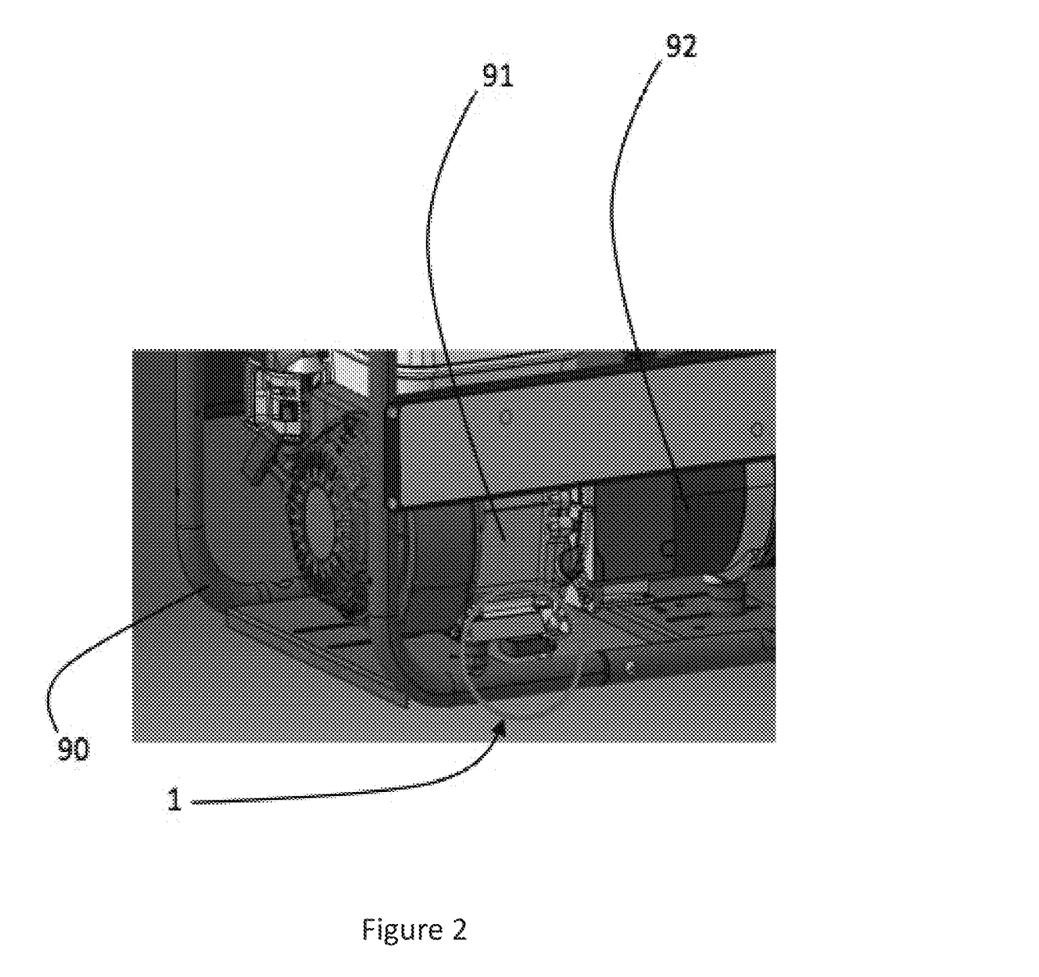
FIG. 2 is a perspective view of a portion of a generator set, without the side cover, including an autonomous device for tracking usage times in accordance with the embodiment of FIG. 1.

The various elements necessary for producing electricity, in particular an engine 91 and an alternator 92, visible in FIG. 2, are mounted on the chassis 90 and under the hood 93.

As shown in FIGS. 1 and 2, the generator set further has an autonomous device 1 for tracking the usage time of the generator set.

This autonomous device is placed in proximity with the engine 91 and the alternator in such a way as to facilitate monitoring these elements. More particularly, such proximity makes it possible to have tracking that is relatively precise and reliable and for which the external environment has only minimal impact on the data collected.

This device 1 is fixed to the engine 91 by way of mechanical fixation means 13, 20, 21.

Figure 3:
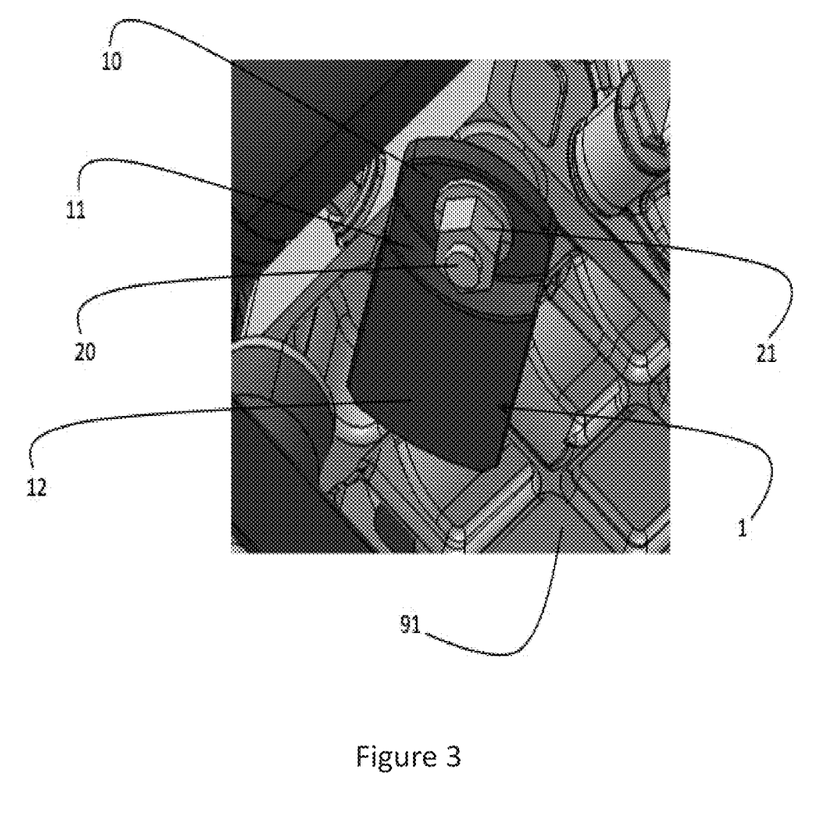
FIG. 3 is a perspective view from below of an autonomous device for tracking usage time that is affixed to the chassis of a generator set, in accordance with the embodiment of FIG. 1.

As can be in FIG. 3, these fixation means are in the form of a threaded rod 20 on which the device 1 is then mounted (in the vicinity of a light 13 shown in FIG. 4), the autonomous device thereafter being held fixed against the chassis by a screw 21 which here is a hexagonal screw.

It is understood that in other embodiments, other fixation means for the device can be provided for the generator set.

For example, a device fixed to the generator set by non-detachable means, for instance attached by soldering, can be provided.

A device that is molded or cast onto an element of the generator set could also be provided.

Figure 4:
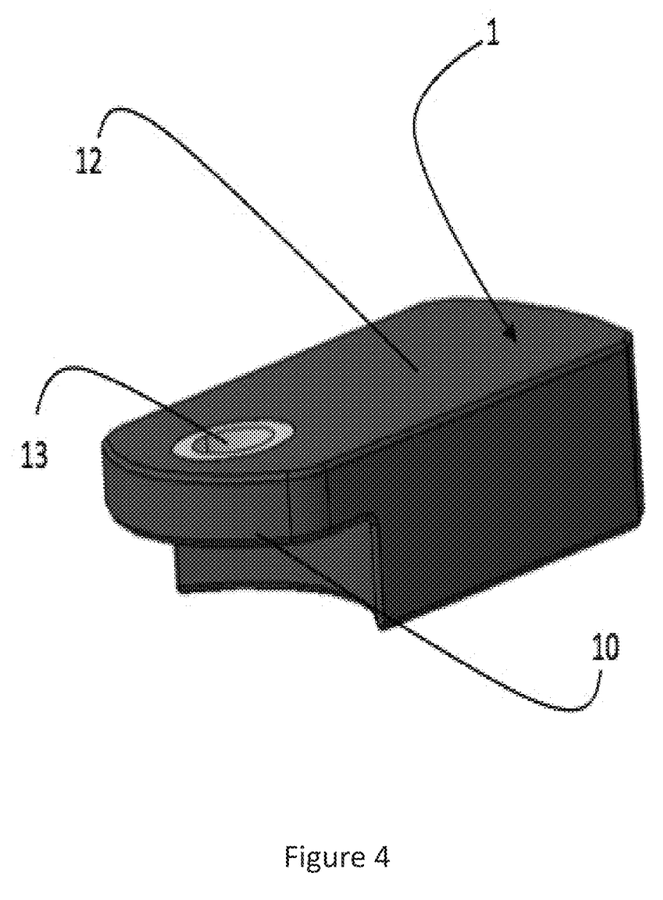
FIG. 4 is a perspective view from above of an autonomous device for tracking usage times in accordance with the embodiment of FIG. 1.
Figure 5:
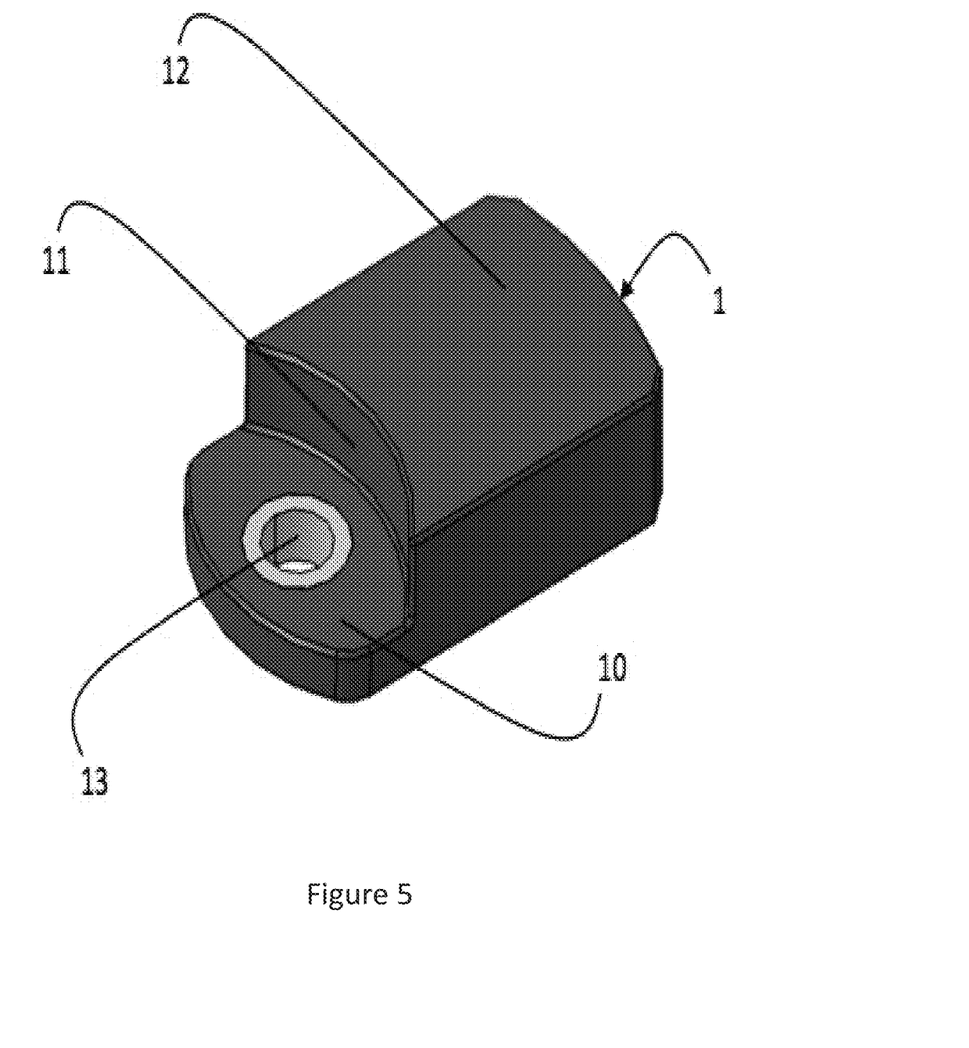
FIG. 5 is a perspective view from below of an autonomous device for tracking usage time in accordance with the embodiment of FIG. 1.

A first embodiment of the autonomous device 1 for tracking the usage time of generator sets will be described hereinafter, in particular with reference to FIGS. 4 through 6.

As shown in the drawings, the device 1 includes a first portion 10 that holds the light 13. The periphery of this light can have a reinforcing ring, which may for example be of metal.

The device 1 includes a second portion 12 having a greater thickness than the first portion 10.

In this embodiment, the first portion 10 has a thickness of between 1 mm and 5 mm (on the order of 5 mm in the version shown), and the second portion 12 has a thickness of between 10 mm and 20 mm (on the order of 13 mm in the version shown).

Furthermore, such an autonomous device 1 can have a length (the longer side) of several centimeters, preferably less than 20 cm.

Furthermore, such an autonomous device 1 has a width of several centimeters, preferably less than 10 cm.

This difference in size between the first portion 10 and the second portion 12 forms a rim 11 defining the first and second portions. This rim can also form a protection for the means for affixing the device 1 to the generator set.

The first portion 10, in this embodiment, has an oval shape. The second portion 12, on the other hand, has a substantially rectangular shape. Other shapes and dimensions are certainly conceivable.

This autonomous device 1 for tracking the usage time of the generator set 9 is capable of furnishing at least one piece of characteristic information about an operating time of this generator set.

Such a piece of characteristic information about this operating time can for example include a number of total hours of operation of the generator set, or a datum on a number of hours of continuous operation of this generator set.

Further data can also be provided by this autonomous device, such as data from a maintenance log or about upkeep of the generator set, the date of activation, or the location of the generator set.

The autonomous device can then include geolocation means in order to function. This last point may in particular be useful for finding the position of a set, in the context of rentals or large-scale construction.

Figure 6:
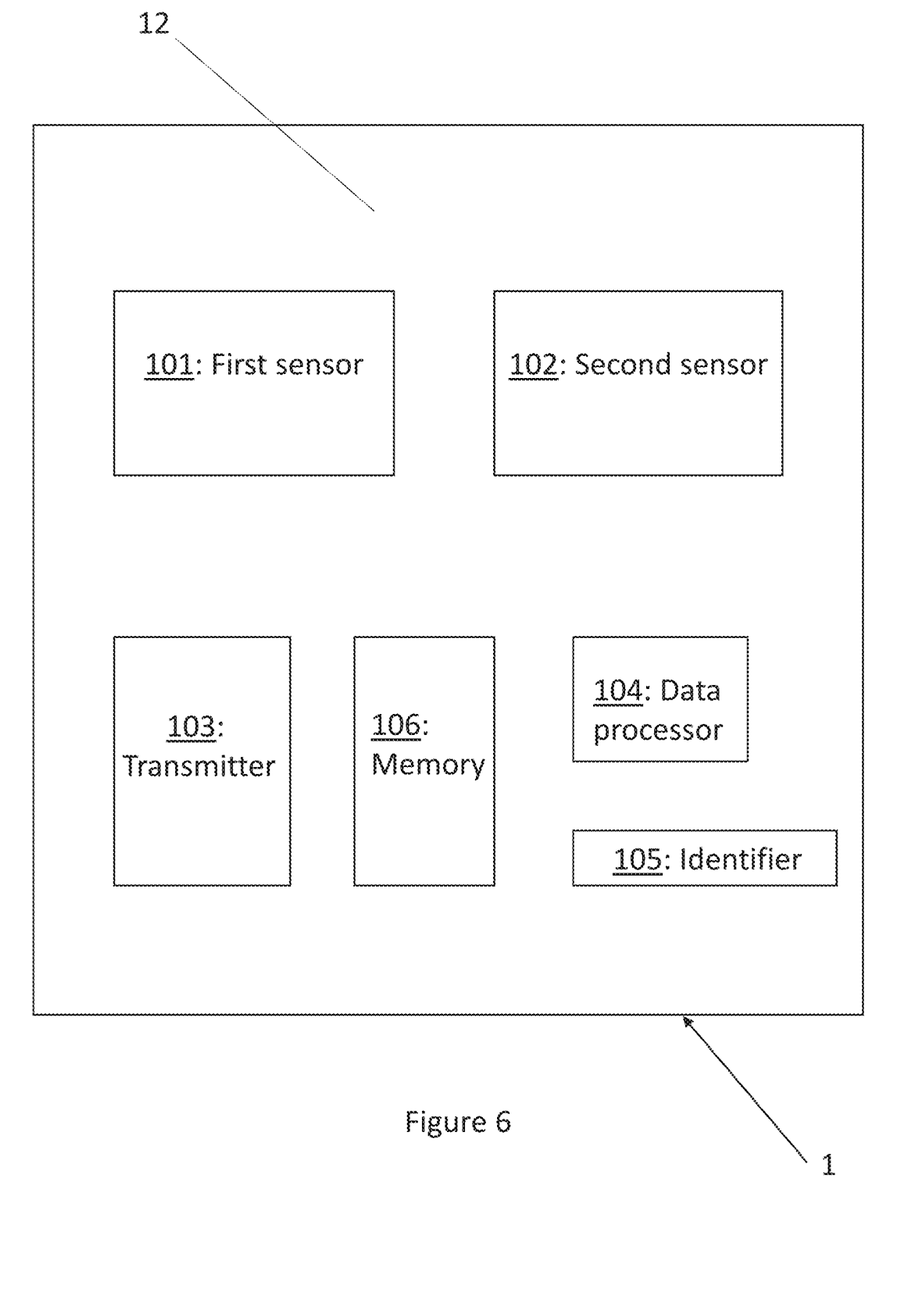
FIG. 6 is a diagram illustrating different components of the autonomous device for tracking usage time of the embodiment of FIG. 1.

As illustrated in FIG. 6, this device 1 includes:
transmission means such as a transmitter 103 or other communication interface capable of transmitting this characteristic information for an operating time of the generator set to an external terminal or to an external server, and
a first sensor 101 capable of measuring a first parameter representing a state of operation of the generator set,
processing means such as a data processor 104 furnishing or providing the characteristic information for an operating time, as a function of at least the first parameter;
storing means such as memory 106 for internal storage of the characteristic information for an operating time.

In this embodiment, the autonomous device 1 further includes a second sensor 102 capable of measuring a second parameter representing a state of operation of the generator set 9.

In the embodiments where a single sensor is employed in the device, the at least one characteristic information of a state of operation of the generator set furnished by the autonomous device depends on the first representative parameter measured.

In this embodiment, the characteristic information of a state of operation of the generator set 9 furnished by the device 1 depends on the first and second representative parameters measured.

This autonomous device can also include an independent power not connected to the generator set, so that it is clearly autonomous.

In the embodiment shown, the first sensor 101 is a magnetic sensor capable of showing the presence of a magnetic field generated by the alternator 92 of the generator set.

The representative parameter measured by this first sensor 101 is thus linked to the rotation of the alternator of the generator set, which is a relatively strong parameter because there is a great difference between the magnetic field generated by the alternator 92 whether or not it is in operation.

In fact, the difference in the displayed value of the magnetic field generated by the alternator is quite large whether the alternator is on or off.

The fact that the device 1 is placed in proximity with the alternator, as shown in FIGS. 1 and 2, also makes reliable displays of this first measured representative parameter possible.

On the other hand, this might be inadequate under certain circumstances, such as if the set is located close to an external source that itself produces a magnetic field (high-tension wires, for example, or some other set that is nearby.

Hence a refined analysis of the magnetic field produced can be provided, for extracting from it a specific characteristic of the alternator (information which can also be used to monitor the state of the alternator and detect an anomaly if one occurs.

In another approach, a vibration sensor can be used that is capable of sensing the vibrations generated by the engine 91 of the generator set 9.

Such a sensor makes it possible to detect the vibrations of the engine 91 when it is in operation.

Moreover, again, this may not be sufficient, under certain circumstances, for example if the set is placed in a moving vehicle, which also produces vibrations.

Then a refined analysis of the vibration produce can be provided for, in order to extract a specific characteristic from this pertaining to the engine (information which can also be used for monitoring the status of the engine and detecting an anomaly, if applicable).

In one particular embodiment, the presence of (at least) two sensors, and in particular one magnetic field sensor and one vibration sensor.

As a result, in the embodiment, the characteristic information of the operating time of the generator set 9 furnished by the device 1 can take into account the first and second representative parameters measured.

The fact of having a first sensor 101 and second sensor 102 available makes it possible to furnish a piece of characteristic information for an operating time that is more reliable, and for example is not perturbed by the outdoor environment where the generator set is placed, and consequently makes it possible to put out a reliable datum by the transmission means 103.

In fact, the generator set is considered by said processing means to be in operation when the two sensors furnish parameters indicating potential operation; that is, when the engine and alternator are in operation.

In fact, on the hypothesis that the generator set is located in an environment where there is a strong magnetic force, the measurements made of the first representative parameter by the first sensor 101 may be perturbed. In any case, by recouping, using the measurements of the second representative parameter produced by the second sensor 102, which is a vibration sensor, the finding of a magnetic field when the generator set is not in operation is not identified as an indication that the generator set is in operation, because then the second sensor does not sense vibrations from the engine 91.

The situation is the same on the hypothesis of vibrations produced in the generator set, for example when it is being moved from place to place. On this hypothesis, the measurements of the second representative parameter made by the second sensor 102 can be perturbed because of the vibrations, for example due to irregularities of the road while the generator set is being transported. Nevertheless, by recouping, with the measurements of the first representative parameter made by the first sensor 101 that senses a magnetic field, the detection of vibrations when the generator set is not in operation is not identified as an operation of the generator set, because the first sensor does not then pick up a magnetic field from the alternator 92.

Thus, taking the analysis of connected representative parameters into account, the magnetic field produced by the alternator 92 and the vibrations produced by the engine 91 here, the device then, by way of the processing means 104, furnishes the characteristic information for an operating time of the generator set.

In this embodiment, the first sensor 101 shows the presence of an electromagnetic field of between 5 µT and 750 µT, and more particularly of between 25 µT and 450 µT.

In addition, the second sensor 102 senses vibrations of between 20 Hz and 200 Hz. More generally, and in the embodiments, this second sensor can sense vibrations of between 10 Hz and 1000 Hz.

Because of this, with these orders of magnitude for the measurements of the first sensor 101 and the second sensor 102, measurements of residual magnitudes that are not characteristic of a state of operation of the generator set are not made.

It should be noted that in other embodiments, it can be provided that the first sensor and the second sensor are of other types.

For example, one can employ a temperature sensor for instance for the engine temperature.

One can also provide a tension sensor at the boundaries of elements of the generator set.

An acoustic sensor can also be provided, for instance to evaluate the sound produced by the engine or by the rotation of the alternator.

Again, one may provide an oil pressure sensor, a sensor for the speed of rotation of the alternator, or an air flux sensor.

Finally, non-autonomous sensors may be provided, such as a sensor for an analog value of the alternator frequency, or a tension sensor connected with a power supply of the generator set.

Furthermore, a mounting sensor for the autonomous device can also be provided on the chassis so as to assure that the autonomous device is mounted properly on the generator set.

In addition, related functions for the sensors employed may be provided. For example, it be provided that the vibration sensor also senses a peak vibration corresponding to a shock on the generator set, for the purpose of producing a piece of information about the risk of deterioration of the generator set.

The processing means or data processor 104 providing the characteristic information for an operating time can, for example, include a microcontroller, which receives the data provided by the sensors and performs processing of these data. Such processing can in particular be achieved in conjunction with a unit for time-based measurement; that unit furnishes a measurement of how much time has elapsed.

The internal storage means or memory 106 for the characteristic information for an operating time has the objective of performing the storage of the data on operation of the device as well as, at least, the characteristic information for a length of operating time.

This storage unit can also be used to safeguard the recordings of data, including in particular a date, time, and location, as well as the length of time the device was used. Other parameters may also be recorded, such as a time when put under tension, a time when something is being transported, etc.

The characteristic information of the operating time of the generator set can then be transmitted by the transmission means to an external terminal or an external server.

Such a terminal can for example be a user's smartphone or a tablet.

The transmission means such as transmitter 103 or other communication interface that communicate the information can be based for example on a technology known by the name Bluetooth "Low Energy".

This kind of technology has the advantage of having low consumption of electricity or energy, which makes it possible for the device 1 to have relatively great energy autonomy, while still having a bidirectional link between the mobile terminal and the device.

In any case, other embodiments can be provided in which the communication mode is unidirectional, from the device to the external mobile terminal or external server.

Communication means based on an NFC, Zigbee, Bluetooth, Zwave, WiFi, LoRa, Sigfox as well as mobile cellular networks or low-power radio networks can be provided. In particular, the device can communicate via protocols destined for the "internet of things".

In this embodiment, and as illustrated in FIG. 6, the device 1 further includes means 105 (e.g., identifier or identification device) for identifying this device.

These identification means, in this embodiment, are unique in order to assure the uniqueness of the device is unitary and, for example, to avoid a change of device among the generator sets.

It can be provided that such identification means (e.g., identifier or identification device) include a serial number linked with the serial number of the generator set. The identifier may be alphanumeric series etched on the autonomous device. The identifier may be a bar code, quick response code, or another scannable image on the autonomous device. The identifier may be a data storage element (e.g., memory) from which the identifier is read. The identifier may be a radio frequency identification (RFID) tag configured to generate a modulated signal when excited by a carrier signal from an external source.

Means for identifying the device can also be provided, requiring matching up of this autonomous device with a mobile terminal, or with the generator set.

As indicated above, one can also, in one embodiment, provide that the autonomous device has geolocation means (e.g., a geolocation device). The geolocation device is configured to receive one or more satellite signals and analyze the signal to calculate a position of the autonomous device relative to a location on Earth. The geolocation device may be a global positioning system (GPS) device.

In this way, possible theft of the generator set can be remedied by detecting the position of the generator set or of the autonomous device.

The device can also include indicators (electroluminescent diodes, screen) that indicate a state and/or signal a need for connection (if the last connection is too old), a need for maintenance (if the time recorded is longer than a threshold value), and so forth.

The present embodiments has the advantage in particular that it enables a user to have the capability of tracking an operating time of a mobile generator set, or even a group of mobile generator sets, and to efficiently manage their maintenance.

Another advantage, in at least one embodiment, is to furnish a solution that is reliable regardless of the context in which the generator set is used.

Another advantage of at least one embodiment is to implement a device which is easy to use and not expensive to operate.

It can also be noted that the installation of the device can be done at the time of manufacture of the set, or later, in the form of an option or a supplement.

Figure 7:
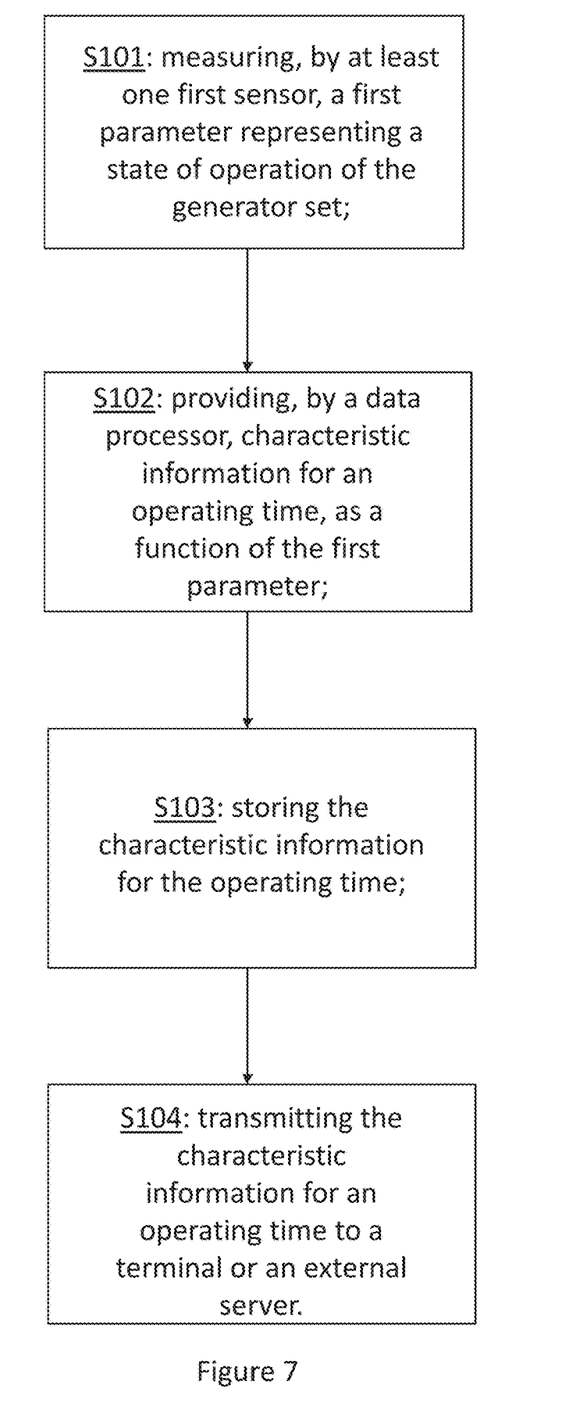
FIG. 7 is a flowchart for the embodiments of FIGS. 1-6.

FIG. 7 illustrates a flow chart for operation of the embodiments of FIGS. 1-6. The acts of the flow chart may be performed by the data processor 104 alone or in combination with the other components of FIG. 6. Act S101 includes measuring, by at least one first sensor, a first parameter representing a state of operation of the generator set. Act S102 includes providing, by a data processor, characteristic information for an operating time, as a function of the first parameter. Act S103 includes storing the characteristic information for the operating time. Act S104 includes transmitting the characteristic information for an operating time to a terminal or an external server.

One or more generator sets may provide power to a load through a generator bus. The generator bus is an electrically conductive path and may be selectively connected through multiple circuit breakers or other types of switches to the generators, the utility system, and other devices.

The phrases "coupled with" or "coupled to" include directly connected to or indirectly connected through one or more intermediate components. Additional, different, or fewer components may be provided. Additional, different, or fewer components may be included.

The data processor 104 (processing means) may include a general processor, digital signal processor, an application specific integrated circuit (ASIC), field programmable gate array (FPGA), analog circuit, digital circuit, combinations thereof, or other now known or later developed processor. The processor may be a single device or combinations of devices, such as associated with a network, distributed processing, or cloud computing.

The data processor may include a memory that is a volatile memory or a non-volatile memory. The memory may include one or more of a read only memory (ROM), random access memory (RAM), a flash memory, an electronic erasable program read only memory (EEPROM), or other type of memory. The memory may be removable from the network device, such as a secure digital (SD) memory card.

In addition to ingress ports and egress ports, a communication interface of the controller may include any operable connection. An operable connection may be one in which signals, physical communications, and/or logical communications may be sent and/or received. An operable connection may include a physical interface, an electrical interface, and/or a data interface.

The communication interface may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

An input device may receive user inputs for thresholds and time periods. The input device may include a button, a switch, a keypad, a touchscreen, a key, an ignition, or other structure configured to allow a user to enter data or provide a command to operate the engine. The input device may include a connection to a network, a smartphone, a tablet, a personal computer configured to electronically transmit the command to the engine. The communication may be wireless or wired (e.g., received by the communication interface).

While the computer-readable medium (e.g., memory) may be a single medium, the term "computer-readable medium" includes a single medium or multiple media, such as a centralized or distributed database, and/or associated caches and servers that store one or more sets of instructions. The term "computer-readable medium" shall also include any medium that can store, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Processors suitable for the execution of a computer program include, by way of example, both general and special purpose microprocessors, and anyone or more processors of any kind of digital computer. Generally, a processor may receive instructions and data from a read only memory or a random access memory or both. The essential elements of a computer are a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

The invention claimed is:

1. An autonomous device for tracking usage time of a generator set, the autonomous device comprising:
   at least one first sensor capable of measuring a first parameter representing a state of operation of the generator set including an engine and an alternator;
   a data processor configured to provide an operating time, as a function of the first parameter;
   a memory configured for internal storage of the operating time; and
   a transmitter configured to transmit the operating time to a terminal or an external server.

2. The autonomous device of claim 1, further comprising:
   at least one second sensor capable of measuring a second parameter representing a state of operation of the generator set, the generator set being considered functional by the data processor when the at least one first sensor and the at least one second sensor provide parameters indicating a potential operation.

3. The autonomous device of claim 1, wherein the at least one first sensor includes:
   a magnetic sensor capable of picking up a presence of a magnetic field generated by the alternator of the generator set.

4. The autonomous device of claim 1, wherein the at least one first sensor includes:
a magnetic sensor picking up the presence of an electromagnetic field.

5. The autonomous device of claim 1, wherein the at least one first sensor is a vibration sensor.

6. The autonomous device of claim 1, further comprising:
a geolocation device configured to calculate a position for the autonomous device.

7. The autonomous device of claim 1, wherein the transmitter is configured to employ a Bluetooth Low Energy communications protocol.

8. The autonomous device of claim 1, further comprising:
an identification device configured to provide a unique identifier for the autonomous device.

9. The autonomous device of claim 2, wherein the at least one first sensor includes a magnetic sensor capable of picking up a presence of a magnetic field generated by the alternator of the generator set,
wherein the at least one second sensor includes a vibration sensor capable of sensing vibrations generated by the engine of the generator set.

10. The autonomous device of claim 4, wherein the electromagnetic field of between 25 and 450 µT.

11. The autonomous device of claim 5, wherein the vibration sensor is configured to sense vibrations of between 20 and 200 Hz.

12. A generator set comprising:
a chassis supporting an engine and an alternator; and
an autonomous device comprising:
at least one first sensor capable of measuring a first parameter representing a state of operation of the generator set;
a data processor configured to provide characteristic information for an operating time, as a function of the first parameter;
a memory configured for internal storage of the characteristic information for an operating time; and
a transmitter configured to transmit the characteristic information for an operating time to a terminal or an external server.

13. The generator set of claim 12, at least one second sensor capable of measuring a second parameter representing a state of operation of the generator set, the generator set being considered functional by the data processor when the at least one first sensor and the at least one second sensor provide parameters indicating a potential operation.

14. The generator set of claim 12, wherein the at least one first sensor includes a magnetic sensor capable of picking up a presence of a magnetic field generated by an alternator of the generator set.

15. The generator set of claim 12, wherein the at least one first sensor is a vibration sensor.

16. The generator set of claim 12, further comprising:
a geolocation device configured to calculate a position for the autonomous device.

17. The generator set of claim 12, further comprising:
an identification device configured to provide a unique identifier for the autonomous device.

18. The generator set of claim 12, further comprising:
a screw configured to fix the autonomous device to the chassis.

19. The generator set of claim 14, wherein the at least one first sensor is a magnetic sensor picking up the presence of an electromagnetic field.

20. A method for an autonomous device for tracking usage time of a generator set, the method comprising:
measuring, by at least one first sensor, a first parameter representing a state of operation of the generator set including an engine and an alternator;
providing, by a data processor, characteristic information for an operating time, as a function of the first parameter;
storing the characteristic information for the operating time; and
transmitting the characteristic information for an operating time to a terminal or an external server.

* * * * *

UNITED STATES PATENT AND TRADEMARK OFFICE
CERTIFICATE OF CORRECTION

| | |
|---|---|
| PATENT NO. | : 11,469,695 B2 |
| APPLICATION NO. | : 16/751603 |
| DATED | : October 11, 2022 |
| INVENTOR(S) | : Gilles Bergot |

It is certified that error appears in the above-identified patent and that said Letters Patent is hereby corrected as shown below:

In the Specification

Replace the paragraph at Column 1, Lines 53 through 59 with the following:
-- Certain sets, particularly high-capacity sets, are equipped with integrated tracking means (e.g., tracking device) that measure the presence of an electrical current and/or voltage produced by the set, and means for calculating (e.g., calculator) the corresponding operating times and for managing maintenance. On the other hand, portable generator sets do not have such a device. --

Signed and Sealed this
Twenty-sixth Day of December, 2023

Katherine Kelly Vidal
*Director of the United States Patent and Trademark Office*